(12) United States Patent
Haworth

(10) Patent No.: US 6,833,996 B2
(45) Date of Patent: Dec. 21, 2004

(54) ELECTRONICS ASSEMBLY

(75) Inventor: Stephen Paul Haworth, Wokingham (GB)

(73) Assignee: Sun Microsystems, Inc., Santa Clara, CA (US)

(*) Notice: Subject to any disclaimer, the term of this patent is extended or adjusted under 35 U.S.C. 154(b) by 132 days.

(21) Appl. No.: 10/166,523

(22) Filed: Jun. 10, 2002

(65) Prior Publication Data

US 2003/0227755 A1 Dec. 11, 2003

(51) Int. Cl.[7] .............................. H05K 7/10; H05K 7/14
(52) U.S. Cl. ....................... 361/730; 361/788; 361/796
(58) Field of Search ................................ 361/796–798, 361/730, 788, 787, 747, 752, 728; 174/50; 211/41.17; 312/223.2, 223.3

(56) References Cited

U.S. PATENT DOCUMENTS

| | | | | |
|---|---|---|---|---|
| 4,980,800 A | * | 12/1990 | Furuta | 361/727 |
| 5,808,876 A | * | 9/1998 | Mullenbach et al. | 361/788 |
| 6,175,490 B1 | * | 1/2001 | Papa et al. | 361/686 |
| 6,219,229 B1 | * | 4/2001 | Lee | 361/683 |
| 6,325,636 B1 | * | 12/2001 | Hipp et al. | 439/61 |
| 6,411,526 B1 | | 6/2002 | Nguyen et al. | |
| 6,498,732 B2 | * | 12/2002 | Sucharczuk et al. | 361/796 |
| 6,563,706 B1 | * | 5/2003 | Strickler | 361/695 |
| 6,590,768 B1 | | 7/2003 | Wiley | |
| 6,700,351 B2 | | 3/2004 | Blair et al. | |
| 6,719,382 B2 | * | 4/2004 | Sucharczuk et al. | 312/223.2 |
| 6,748,474 B1 | * | 6/2004 | Caldara et al. | 710/301 |
| 2003/0063454 A1 | * | 4/2003 | Wilson et al. | 361/796 |

* cited by examiner

*Primary Examiner*—Tulsidas Patel
*Assistant Examiner*—Dameon E. Levi
(74) *Attorney, Agent, or Firm*—Meyertons Hood Kivlin Kowert & Goetzel, P.C.; B. Noël Kivlin

(57) ABSTRACT

1. An electronics assembly comprises:

(i) a frame (1);
(ii) a plurality of power supply modules (2) for supplying power to electrical circuitry of the assembly, each of which has an input power connector and an output power connector (27); and
(iii) a power inlet connection module (26) which is electrically connected to a plurality of the power supply modules;

wherein the power inlet connection module (26) is separated from the power supply modules (2) by an internal wall (36) of the frame which has, on one side thereof, at least one location element (50) for locating the power inlet connection module relative to the wall and, on the other side thereof, at least one location element (54) for locating each power supply module that is connected to the power inlet connection module relative to the wall so that the power supply modules are aligned with the power inlet connection module by means of the internal wall. Such an assembly enables blind mating of the power inlet connection module and the power supply modules to be performed relatively easily.

16 Claims, 4 Drawing Sheets

ELECTRONICS ASSEMBLY

BACKGROUND OF THE INVENTION

The present invention relates to electronics assemblies, and is primarily concerned with racked assemblies. Many such assemblies will be located in racks for housing in for example nineteen inch cabinets, or other size cabinets such as twenty three inch or metric cabinets. The assemblies may for instance be employed as servers for a number of systems, for example in local area networks (LANs), wide area networks (WANs), telecommunications systems or other operations such as database management or as internet servers.

Such an assembly will typically comprise a supporting frame that houses a motherboard or backplane and a number of daughterboards or module cards that extend in planes generally perpendicular to the plane of the motherboard and which are connected to the motherboard by connectors, e.g. high density connectors, so that the daughterboards can simply be located on guides and pushed toward the motherboard in order to connect them to it.

One form of assembly that is intended to act as a server and which is currently under development, is intended as far as possible to be in continuous operation and therefore has a plurality of power supply units that can receive, for example, mains a.c. power (although d.c. power supply units are an option) and deliver d.c. power at the appropriate working voltage to the motherboard and to any other circuitry in the assembly. Each power supply unit therefore usually has a transformer, rectifier, control circuitry and a dedicated cooling fan. In addition, more power supply units than necessary for operation of the assembly are provided in order to provide a degree of redundancy that will allow one or more supplies to be replaced without interruption of functioning of the server.

In addition, it is desirable to guard against the system going down in the event of a power failure in part of the building in which the assembly is located, either due for example to fusing of a ring circuit in the building or to inadvertent unplugging of the assembly from a mains power socket. For this reason power is intended to be taken from more than one ring circuit of the building and fed into a power input connection arrangement in which power can be supplied from each mains input to any of the power supply units as circumstances demand. This power inlet connection arrangement is in the form of a module having a number of power input connectors on an input side thereof and a number of power output connectors (one for each power supply unit) on an input side. In this way the system is guarded as far as practicable, against power failure, either due to failure of power supply or to failure of any internal systems. The modules typically have a rectangular cross-section and are normally 10 to 20 cm in length having their connectors rigidly located at an end thereof so that the modules can be inserted into an appropriate recess in the frame and connected directly to the other module, whether the power supply module or the power inlet connection module, and an electrical connection be formed simply by pushing. Accordingly the electrical connectors are push-fit (usually mains voltage) connectors, for example according to IEC 320.

According to the proposed server design, four power supply modules are intended to be fed by the power inlet connection module, the power inlet connection module being installed by sliding it into a recess at the rear of the frame, and the four power supply modules being installed by sliding them into the front of the frame.

However, it has proved very difficult to connect the power supply modules and the power inlet connection module together correctly, due mainly to the fact that the modules have to be blind mated, that is to say, they are mated in the centre of the frame to which the engineer has no access or vision during mating. Furthermore the form of plug and socket connection that is most commonly employed, the IEC 320 connector, is not intended for this type of use but instead is intended for use in circumstances where the plug or socket can be manually grasped and manipulated during connection.

SUMMARY OF THE INVENTION

According to one aspect, the present invention provides an electronics assembly which comprises:

(i) a frame;
(ii) a plurality of power supply modules for supplying power to electrical circuitry of the assembly, each of which has an input power connector and an output power connector; and
(iii) a power inlet connection module which is electrically connected to a plurality of the power supply modules; wherein the power inlet connection module is separated from the power supply modules by an internal wall of the frame which has, on one side thereof, at least one location element for locating the power inlet connection module relative to the wall and, on the other side thereof, at least one location element for locating each power supply module that is connected to the power inlet connection module relative to the wall so that the power supply modules are aligned with the power inlet connection module by means of the internal wall.

This form of assembly has the advantage that it is possible relatively easily for a service engineer to replace any of the power supply modules or the power inlet connection modules and to connect the replacement module to the remaining modules with a minimum of effort.

The power supply modules may be stacked together within the frame, normally within their own individual slide-in recesses, and will usually together occupy a volume of the same height and width as that of the power inlet connection module.

It is possible for more than one power inlet connection modules to be employed if, for example, a large number of power supply modules were being supplied, but in most cases only a single power inlet connection module will be needed, which will be connected to all the power supply modules.

The power supply modules are usually designed to have their input power connectors and their output power connector on the same surface thereof. This enables all the input power connectors to be aligned with a bank of input power sockets on the power inlet connection module, and for the d.c. output power connectors of each power supply module to be connected to a common power distribution circuit board. The power inlet connection module will typically be generally flat since it will have a shape to enable it to mate with a number of power supply modules that are stacked together, in which case the power distribution circuit board is conveniently arranged next to the power inlet connection module and in a plane parallel to the plane thereof.

The location elements on the internal wall of the frame which engage corresponding surfaces or elements on the various modules are normally separate from any electrical connector thereof so that the modules as a whole are guided into their correct position during installation thereof. The location elements on at least one side of the internal wall, and preferably on both sides thereof, are preferably in the form of a pin that can engage a corresponding recess in the relevant module. The pins will normally have a tapered end in order to provide a degree of lateral guidance during insertion of the modules. In addition, the location element corresponding to the power inlet connection module and/or each power supply module is preferably offset from an axis of symmetry of the module in order to ensure correct orientation of the module with respect to the frame.

The internal wall of the frame may be mechanically connected to the motherboard with a relatively tight tolerance in order to enable accurate alignment to be achieved with other components in the system and especially in order to achieve accurate alignment between the power distribution board connectors and the motherboard connectors. In addition, it is possible for the power distribution board to be mechanically connected to the internal wall or the location element for the power inlet connection module, either directly or via card guides for the power distribution board, in order to provide accurate alignment of the connectors on the power distribution board with those on the power supply modules.

According to another aspect, the invention provides a frame for an electronics assembly which comprises:

(i) a first location in which a plurality of power supply modules can be received; and
(ii) a second location in which a power inlet connection module can be received so that it is electrically connectable to each of a number of power supply modules received in said first location;

wherein the first location and the second location are separated from one another by an internal wall of the frame, the wall having on one side thereof at least one location element for locating the power inlet connection module, and, on the other side thereof, at least one location element for locating each power supply module so that, when the power supply modules and the power inlet connection module are received in the frame they are aligned with one another by the wall.

According to a further aspect, the invention provides a method of blind mating of modules in an electronics assembly which comprises a frame having a first location in which a plurality of power supply modules can be received, and a second location in which a power inlet connection module can be received so that it is electrically connectable to each of a number of power supply modules in the first location, wherein the first location and the second location are separated from one another by an internal wall of the frame, the wall having on one side thereof at least one location element for locating the power inlet connection module and, on the other side thereof, at least one location element for locating each power supply module, the method comprising sliding the power inlet connection module into the second location and the power supply modules into the first location so that the power inlet connection module and the power supply modules are guided into their correct relative position and into mating engagement by the location elements on the wall.

According to yet another aspect, the invention provides a power inlet connection module for an electronics assembly, the module having a number of power inlet connectors on an input side thereof and a number of power output connectors on an output side thereof such that electrical power can be supplied to any of the power output connectors from any one or more of the power inpet connectors, and the module has on the output side thereof a location element to allow the module to be inserted into a recess in a frame of an electronics assembly and guided by engagement of the location element with a corresponding location element at a distal end of the recess.

It is believed that the wall employed in the present invention is novel per se and so, according to yet a further aspect, the invention provides a wall for mounting in an electronics rack carcase which includes at least one locating element on one side thereof for guiding and locating a power inlet distribution module that is received by the rack, and a plurality of locating elements on the other side thereof for guiding and locating a plurality of power supply modules that are received by the rack, so that the power inlet distribution module and the power supply modules can be inserted into opposite sides of the rack and guided into mating engagement by the location elements on the wall.

BRIEF DESCRIPTION OF THE DRAWINGS

Embodiments of the present invention will now be described in detail with reference to the accompanying drawings, in which corresponding parts are given like reference numbers. In the drawings.

DESCRIPTION OF PARTICULAR EMBODIMENTS

Figure 1:
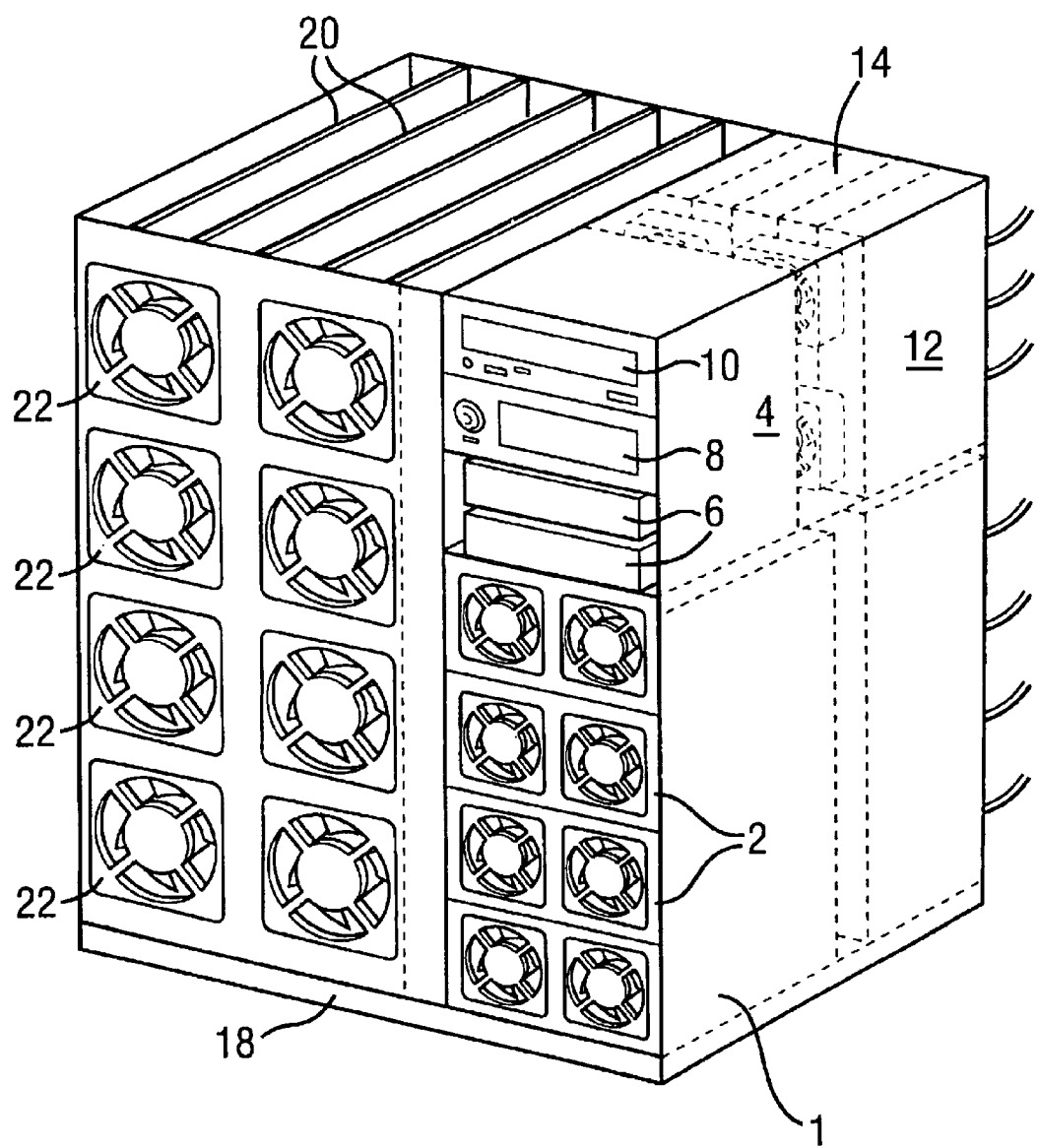
FIG. 1 is a schematic perspective view of an assembly according to the present invention.
Figure 2:
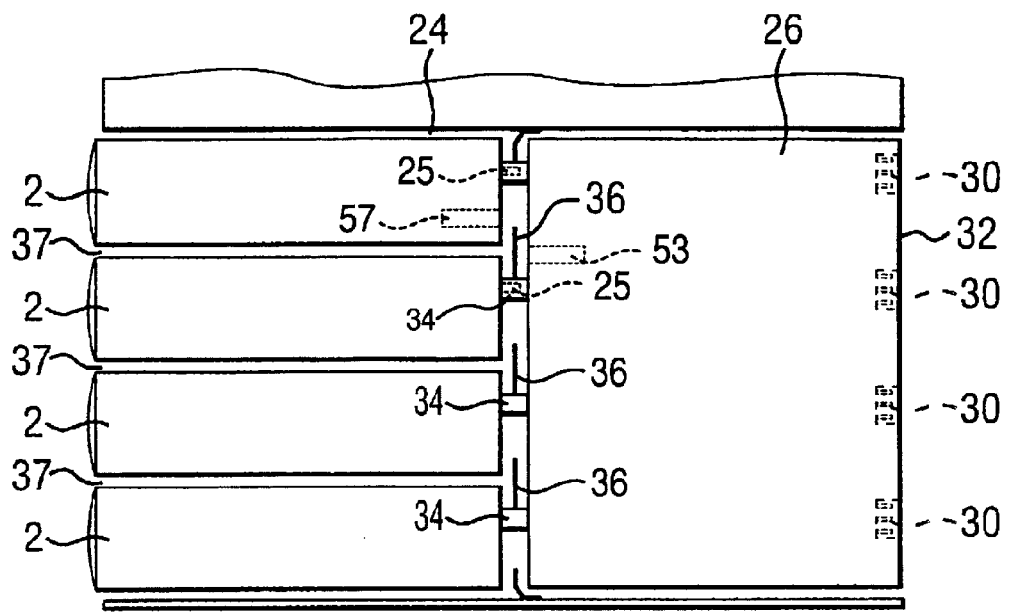
FIG. 2 is a schematic sectional elevation through the power distribution part of the assembly.
Figure 3:
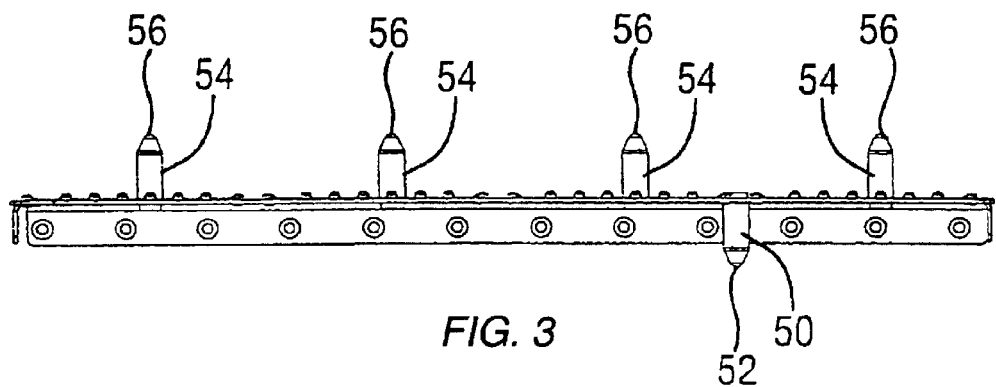
FIG. 3 is a side elevation of an internal wall used in the assembly according to the invention.
Figure 4:
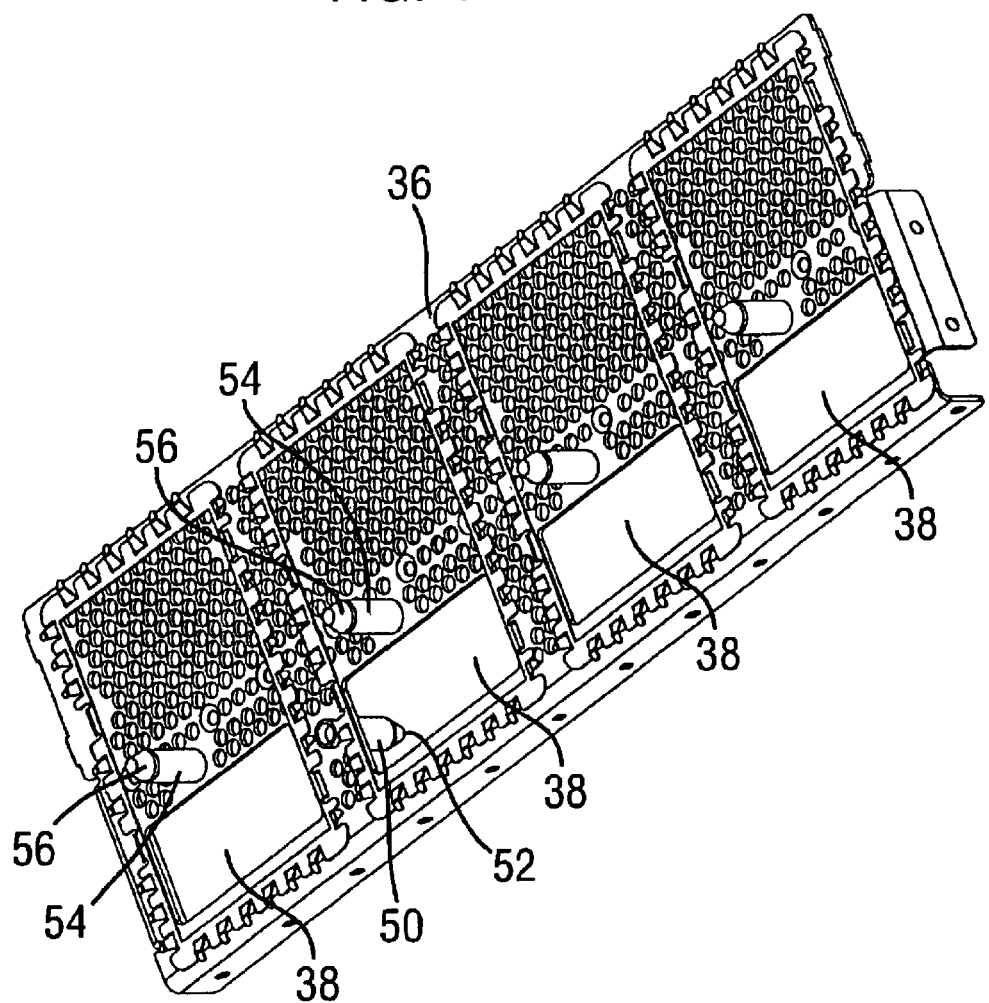
FIG. 4 is a perspective view of the wall of FIG. 3.
Figure 5:
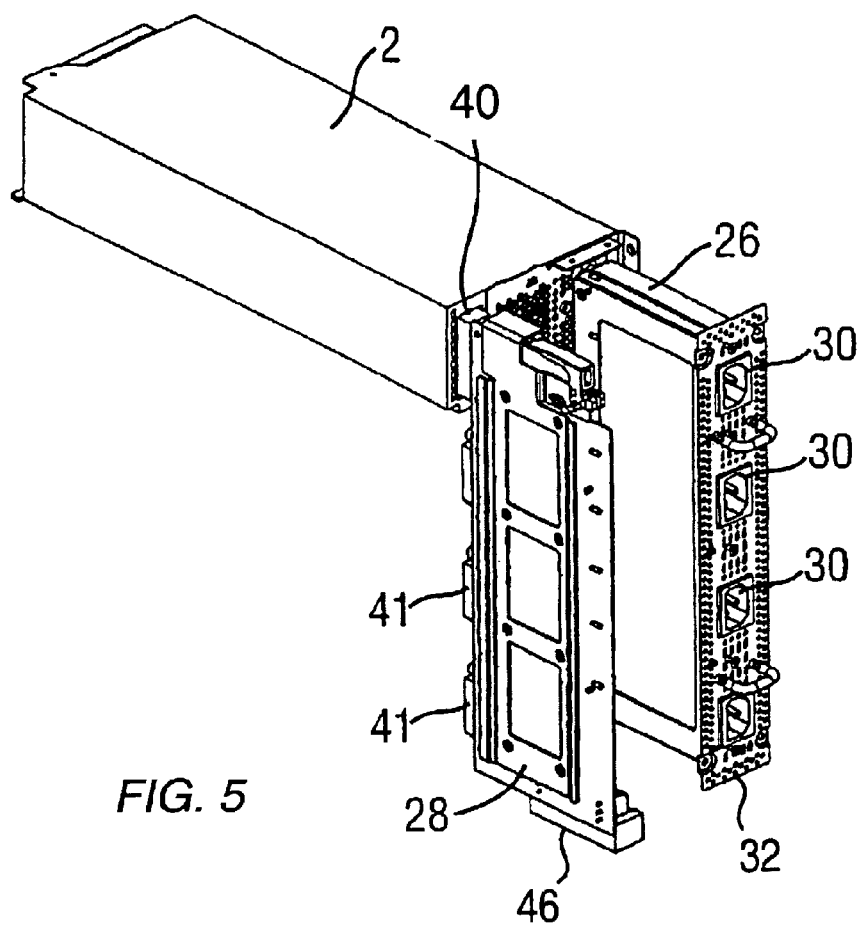
FIG. 5 is a perspective view of a power inlet connection module, internal wall and one power supply module of the assembly.
Figure 6:
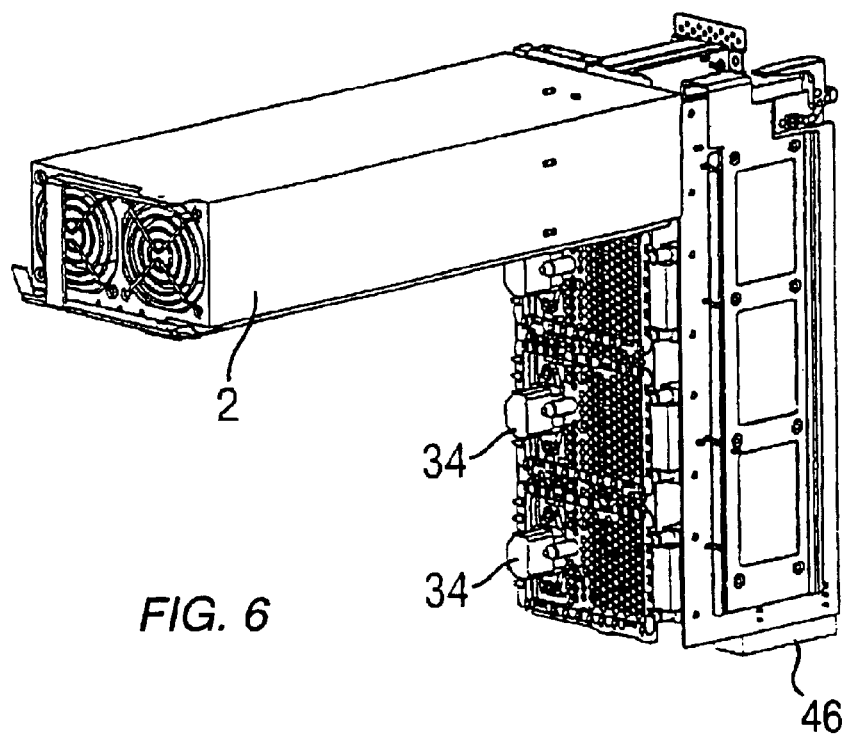
FIG. 6 is a perspective view of the power inlet connection module, internal wall and power supply module of FIG. 5 taken from a different angle.

Referring now to the drawings, in which like reference numerals are used to designate corresponding elements, FIG. 1 shows an assembly according to the invention that forms part of a server that may be employed for a number of services, for example as part of a local area network (LAN) and is designed as a nineteen inch rack to be located in an electronics cabinet.

The assembly comprises a frame 1 in which the various components are located. The frame 1 contains a part 4 that contains hard disk drives 6, a tape drive 8 and a CD-ROM or digital video disc drive 10, and a part 12 that contains a number of I/O cards 14. A motherboard is located within the frame in a horizontal plane at the bottom of the frame in a tray-shaped holder 18, and a number of daughterboards 20 are arranged next to each other in vertical planes above the motherboard and to the side of the power modules 2. The daughterboards may serve any of a number of purposes, for example having CPUs or may be repeater boards etc. Finally, a number of fans 22 are provided in an array at the front of the frame in order to blow air through the assembly between the daughterboards 20 for cooling.

Four power supply modules 2 are provided in a part 24 of the frame together with a power inlet connection module 26 that takes a.c. power from the mains and distributes the power to each of the power supply modules. Each power supply module 2 is capable of receiving a.c. mains voltage via plug 25, transforming, rectifying and smoothing it and supplying output d.c. voltage through connector 27, located on the same side of the power supply module as the power input plug, to a common power distribution board 28 and delivering the power to the motherboard via connector 46. In some systems, for example where a.c. mains is not available, a d.c. source may be used, in which case the power input connection module and the power supply modules will all have d.c. power inputs and outputs.

The system employs a degree of redundancy with the power supply modules 2 so that one or two of the modules can be removed for servicing or repair while the system can still operate.

Mains a.c. power is supplied to the power supply modules 2 by means of the power inlet connection module 26. The power inlet connection module 26 has four mains plugs 30 on its rear surface 32 for connection to up to four ring mains via standard cabling (not shown) and can channel the current to any of four IEC 320 sockets 34 into which the power supply modules 2 are plugged.

The frame 1 is provided with an internal wall or bulkhead 36 that separates the location at the rear of the frame for receiving the power inlet connection module 26 from four recesses 37 for receiving the power supply modules 2, and which is provided with four apertures 38 through which the bodies of the sockets can extend to the other side of the wall. The four rectangular apertures 38 in the wall are large enough to receive not only the sockets 34 of the power inlet connection module 26, but also the four low voltage d.c. power connectors of the power supply modules which extend to the rear side of the wall at a position adjacent to the location for the power inlet connection module. At the rear side of the wall 36, the frame is also provided with a pair of vertically extending card guides (not shown) for receiving the power distribution circuit board 28 that can be introduced from above and slide vertically downwards into connection with the motherboards be means of connectors 46. When inserted the power distribution circuit board will be next to, and in a plane parallel to the plane of power inlet connection module 26.

The internal wall is provided on its side facing the rear part of the frame with a guiding and locating pin 50 having a tapering tip 52 which can engage a recess in the end surface of the connection module 26 in order to allow the power inlet connection module to be guided to its correct location when it is inserted into the rear of the housing 1. In addition, the wall 36 is provided on its opposite (front) surface with four further guiding and locating pins 54 each having a tapering tip 56 which can each engage a recess 57 in the end surface of the power supply module 2 to allow each of the power supply modules 2 to be guided to their correct location when they are inserted into their recesses at the front of the frame 1.

In order to assemble the relevant components, the power distribution circuit board 28 is inserted into the top of the frame 1 and is lowered on its card guides into connection with the motherboard. The power inlet connection module 26 is inserted into its location at the rear of the frame 1 and slid horizontally until the guidance pin 50 engages the recess in 53 in the module and the a.c. power sockets 34 extend through the recesses in the wall 36. Each power supply module 2 can then be inserted into the front end of the frame and be slid into position where the pins 54 engage the recesses 57 in the end of the modules and the pins of the connectors a.c. input connectors of the power supply modules have engaged the sockets 34 of the connection module 26. In this operation the d.c. output connectors 40 extend through the apertures 38 in the internal wall 36 into mating connection with d.c. connectors 41 on the power distribution board.

By virtue of the fact that the pins 50 and 54 are rigidly located on the internal wall 36, for example by spot welding, they can be located with respect to one another to a high degree of accuracy and thereby allow correct mating of the pins of the plugs 25 of the power supply modules 2 with the sockets 34 of the power inlet connection module 26, even though the plugs and sockets will be blind mated by insertion of the relevant modules from opposite sides of the frame 1.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during the prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

Mention d.c. inputs in this invention determined only by the construction of the chassis.

What is claimed is:

1. An electronics assembly which comprises:
   (i) a frame;
   (ii) a plurality of power supply modules for supplying power to electrical circuitry of the assembly, each of which has an input power connector and an output power connector; and
   (iii) a power inlet connection module which has a plurality of electrical connectors and which is electrically connected to a plurality of the power supply modules by mating of the electrical connectors and the input power connectors;
   wherein the power inlet connection module is separated from the power supply modules by an internal wall of the frame which has, on one side thereof, at least one location element for locating the power inlet connection module relative to the wall and, on the other side thereof, at least one location element for locating each power supply module that is connected to the power inlet connection module relative to the wall so that the power supply modules are aligned with the power inlet connection module by means of the internal wall, the location element for the power inlet connection module or for a power supply module being separate from any electrical connector thereof.

2. An assembly as claimed in claim 1, wherein the power supply modules are stacked together within the frame.

3. An assembly as claimed in claim 1, wherein the power supply modules each has its input power connector and its output power connector on the same surface thereof.

4. An assembly as claimed in claim 1, which includes a single power inlet connection module that is electrically connected to all the power supply modules.

5. An assembly as claimed in claim 1, wherein the output power connector of each power supply module is connected to a common power distribution circuit board.

6. An assembly as claimed in claim 5, wherein the power inlet connection module is generally flat, and the power distribution circuit board is arranged next to the power inlet connection module and in a plane parallel to the plane thereof.

7. An assembly as claimed in claim 1, wherein the or each location element on at least one side of the internal wall is in the form of a pin that can engage a recess in its corresponding module.

8. An assembly as claimed in claim 7, wherein the or each pin has a surface for providing correct lateral positioning of its corresponding module.

9. An assembly as claimed in claim 1, wherein the location element corresponding to the power inlet connection module and/or each power supply module is offset from an axis of symmetry of the module in order to ensure correct orientation of the module.

10. An assembly as claimed in claim 1, wherein the input power connectors of the power supply modules are IEC 320 connectors.

11. An assembly as claimed in claim 1, which includes a motherboard that is connected to a plurality of daughterboards, wherein the motherboard is mechanically connected directly to the internal wall.

12. A frame for an electronics assembly which comprises:
   (i) a first location in which a plurality of power supply modules can be received; and
   (ii) A second location in which a power inlet connection module can be received so that it is electrically connectable to each of a number of power supply modules received in said first location;
   wherein the first location and the second location are separated from one another by an internal wall of the frame, the wall having a plurality of apertures therein to allow electrical connection of the power supply modules to the power inlet connection module, and having on one side thereof at least one location element for locating the power inlet connection module, and, on the other side thereof, at least one location element for locating each power supply module so that, when the power supply modules and the power inlet connection module are received in the frame they are aligned with one another by the wall, the location element for the power inlet connection module or for a power supply module being separate from any electrical connector thereof.

13. A frame as claimed in claim 12, wherein the or each location element on at least one side of the internal wall is in the form of a pin that can engage a recess in its corresponding module.

14. A power inlet connection module for an electronics assembly, the module having a number of power inlet connectors on an input side thereof and a number of power output connectors on an output side thereof such that electrical power can be supplied to any of the power output connectors from any one or more of the power inlet connectors, and the module has on the output side thereof a location element that is separate from the power output connectors, to allow the module to be inserted into a recess in a frame of an electronics assembly and guided by engagement of the location element with a corresponding location element at a distal end of the recess.

15. A module as claimed in claim 14, wherein the location element on the output side thereof comprises a recess for receiving a guiding pin.

16. A wall for mounting in an electronics rack carcase which has a plurality of apertures therein and includes at least one locating element on one side thereof for guiding and locating a power inlet distribution module that is received by the rack, and a plurality of locating elements on the other side thereof for guiding and locating a plurality of power supply modules that are received by the rack, so that the power inlet distribution module and the power supply modules can be inserted into opposite sides of the rack and guided into mating engagement through the apertures by the location elements on the wall, the locating elements for the power inlet connection module or for a power supply module being separate from any electrical connector thereof.

* * * * *